(12) United States Patent
Lee et al.

(10) Patent No.: US 10,388,786 B2
(45) Date of Patent: Aug. 20, 2019

(54) NONVOLATILE MEMORY DEVICE

(71) Applicant: SK hynix Inc., Icheon-si (KR)

(72) Inventors: Sanghun Lee, Icheon-si (KR); Yong Soo Choi, Seongnam-si (KR)

(73) Assignee: SK hynix Inc., Icheon-si (KR)

(*) Notice: Subject to any disclaimer, the term of this patent is extended or adjusted under 35 U.S.C. 154(b) by 0 days.

(21) Appl. No.: 15/860,851

(22) Filed: Jan. 3, 2018

(65) Prior Publication Data

US 2018/0286987 A1 Oct. 4, 2018

(30) Foreign Application Priority Data

Mar. 31, 2017 (KR) .................. 10-2017-0042069

(51) Int. Cl.
| | |
|---|---|
| *H01L 29/78* | (2006.01) |
| *H01L 29/04* | (2006.01) |
| *H01L 29/49* | (2006.01) |
| *H01L 29/66* | (2006.01) |
| *H01L 29/786* | (2006.01) |
| *H01L 21/28* | (2006.01) |
| *H01L 29/51* | (2006.01) |
| *H01L 27/1159* | (2017.01) |
| *H01L 27/11585* | (2017.01) |

(52) U.S. Cl.
CPC .. *H01L 29/78391* (2014.09); *H01L 21/28291* (2013.01); *H01L 27/1159* (2013.01); *H01L 29/045* (2013.01); *H01L 29/4908* (2013.01); *H01L 29/516* (2013.01); *H01L 29/66969* (2013.01); *H01L 29/7869* (2013.01); *H01L 27/11585* (2013.01)

(58) Field of Classification Search
CPC .......... H01L 29/6684; H01L 29/78391; H01L 27/1159; H01L 29/66795; H01L 21/28291; H01L 29/516
See application file for complete search history.

(56) References Cited

U.S. PATENT DOCUMENTS

| | | | |
|---|---|---|---|
| 7,465,980 B2 | 12/2008 | Arimoto et al. | |
| 2011/0049592 A1* | 3/2011 | Yoon ................. | G11C 11/22 257/295 |
| 2016/0181432 A1 | 6/2016 | Tsubuku et al. | |
| 2017/0162250 A1* | 6/2017 | Slesazeck ......... | H01L 29/78391 |
| 2018/0006129 A1* | 1/2018 | Xing ................. | H01L 29/4236 |

OTHER PUBLICATIONS

2014 Jpn. J. Appl. Phys. 53 04ED18, S. Yamazaki, et al,; "Properties of crystalline In—Ga—Zn-oxide semiconductor and its transistor characteristics".

* cited by examiner

*Primary Examiner* — Changhyun Yi

(57) ABSTRACT

A ferroelectric memory device is disclosed. The ferroelectric memory device includes a substrate, an indium-gallium-zinc oxide layer disposed on the substrate, a ferroelectric material layer disposed on the indium-gallium-zinc oxide layer, a gate electrode layer disposed on the ferroelectric material layer, and a source electrode layer and a drain electrode layer that are disposed the ends of the gate electrode. The indium-gallium-zinc oxide layer is recessed to form a trench at the ends of the gate electrode. The trench is filled with a conductive material to form the source electrode layer and the drain electrode layer.

20 Claims, 20 Drawing Sheets

NONVOLATILE MEMORY DEVICE

CROSS-REFERENCE TO RELATED APPLICATION

The present application claims priority under 35 U.S.C. 119(a) to Korean Patent Application No. 10-2017-0042069, filed on Mar. 31, 2017, which is herein incorporated by reference in its entirety.

BACKGROUND

1. Technical Field

Embodiments of the present disclosure relate to a ferroelectric memory device.

2. Related Art

Generally, a ferroelectric material refers to a material having spontaneous electrical polarization in the absence of an applied external electric field. More specifically, the ferroelectric material can maintain one of two stable remanent polarization states. Thus, a ferroelectric material may be utilized to store information "0" or "1" in a nonvolatile manner.

Because the remanent polarization in a ferroelectric material can be switched by application of an external electric field, studies for the use of ferroelectric materials in a nonvolatile memory device have been actively conducted. As one example, in a cell structure including one transistor and one capacitor, a memory device employs a ferroelectric material as a dielectric layer of the capacitor. As another example, in a cell structure including one transistor, a memory device employs a ferroelectric material as a gate dielectric layer of the transistor.

SUMMARY

In an aspect of the present disclosure, a ferroelectric memory device reliably stores a plurality of levels of logic information.

The ferroelectric memory device includes a substrate, an indium-gallium-zinc oxide layer disposed on the substrate, a ferroelectric material layer disposed on the indium-gallium-zinc oxide layer, and a gate electrode layer disposed on the ferroelectric material layer.

In another aspect of the present disclosure, a ferroelectric memory device includes a substrate, an indium-gallium-zinc oxide layer having a C-axis aligned crystal structure (in reference to crystallographic a-b-c reference axes) and disposed on the substrate, an insulation layer disposed on the indium-gallium-zinc oxide layer, a ferroelectric material layer disposed on the insulation layer, and a gate electrode layer disposed on the ferroelectric material layer. The ferroelectric material layer includes at least one of hafnium oxide ($HfO_2$), zirconium oxide ($ZrO_2$), and ($Hf_{0.5}Zr_{0.5}O_2$). The ferroelectric material layer stores one of a plurality of remanent polarization orientation states in a nonvolatile manner. The plurality of remanent polarization orientation states correspond to a plurality of program voltages applied to the gate electrode layer.

According to yet another aspect of the present disclosure, a ferroelectric memory device includes a substrate, an indium-gallium-zinc oxide layer having a C-axis aligned crystal structure (in reference to crystallographic a-b-c reference axes) and disposed on the substrate, an insulation layer or gate dielectric layer disposed on the indium-gallium-zinc oxide layer, a ferroelectric material layer disposed on the insulation layer or gate dielectric layer, a gate electrode layer disposed on the ferroelectric material layer, a channel region disposed on or in the indium-gallium-zinc oxide layer below the gate electrode layer, and a source electrode layer and a drain electrode layer disposed in the indium-gallium-zinc oxide layer opposite to each other with respect to the channel region. The ferroelectric material layer stores one of a plurality of remanent polarization orientation states in a nonvolatile manner. The plurality of remanent polarization orientation states correspond to a plurality of program voltages applied to the gate electrode layer. The channel region has one of a plurality of channel resistance states corresponding to the one of the plurality of remanent polarization states when a read voltage is applied to the gate electrode layer.

DETAILED DESCRIPTION

Figure 1:
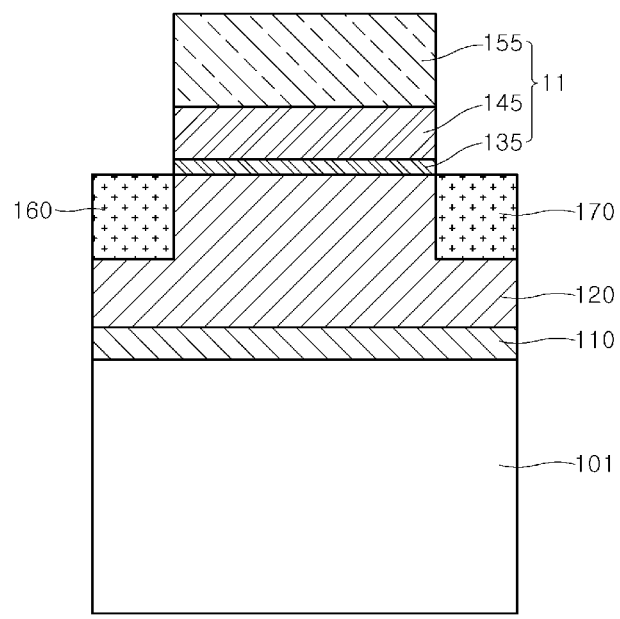
FIG. 1 is a schematic view illustrating a portion of a ferroelectric memory device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If a first element is referred to as located on a second element, it may be understood that the first element is directly located on the second element; that an additional element may be interposed between the first element and the second element; or that a portion of the first element is directly located on a portion of the second element. The same reference numerals may refer to the same elements throughout the specification.

In addition, expression of a singular form of a word includes the plural forms of the word unless clearly used otherwise in the context of the disclosure. The terms "comprise", "have", or "include" are intended to specify the presence of a feature, a number, a step, an operation, an element, a component, a part, or combinations thereof, but the terms do not preclude the presence or possibility of the addition of one or more other features, numbers, steps, operations, elements, components, parts, or combinations thereof.

Further, each step or process in a method or a manufacturing method need not be performed in any order set forth in the disclosure unless a specific sequence is explicitly described. In other words, each step or process in a method or manufacturing method disclosed herein may be performed sequentially in the stated order, may be performed out of sequence from the state order, or may be performed at the same time as one or more other steps or processes. The steps or processes may also be performed in a reverse order.

In this disclosure, a programming or erasing operation of a ferroelectric memory device may refer to an operation that alters the orientation of the remanent polarization in a ferroelectric material layer. The electrical resistance measured in a channel region between a source electrode layer and a drain electrode layer may change during a read operation of the ferroelectric memory device by changing the orientation of the remanent polarization.

A ferroelectric memory device according to an embodiment of the present disclosure may include a transistor-type device having a ferroelectric material layer disposed on an indium-gallium-zinc oxide layer. As an example, the indium-gallium-zinc oxide layer may include a semiconductor material having a crystal structure aligned in a c-axis direction (in reference to crystallographic a-b-c reference axes). In addition, the indium-gallium-zinc oxide layer may have sufficient charge mobility to act as an active layer of a thin film transistor, and as described below, may have a relatively low leakage current as compared to conventional doped silicon semiconductors.

Embodiments of the present disclosure provide ferroelectric memory devices capable of reliably implementing multilevel information using an indium-gallium-zinc oxide layer and a ferroelectric material layer.

FIG. 1 is a schematic view illustrating a portion of a ferroelectric memory device according to an embodiment of the present disclosure. Referring to FIG. 1, ferroelectric memory device 10 may include a substrate 101, an indium-gallium-zinc (In—Ga—Zn) oxide layer 120, and a gate structure 11. The gate structure 11 may include a gate dielectric layer 135, a ferroelectric material layer 145 and a gate electrode layer 155. The ferroelectric memory device 10 may include a source electrode layer 160 and a drain electrode layer 170 that are disposed at both ends, or respective sides, of the gate structure 11. Further, the ferroelectric memory device 10 may include an interlayer insulation layer 110 disposed between the substrate 101 and the indium-gallium-zinc oxide layer 120. The ferroelectric memory device 10 may take the form of a transistor controlling a channel resistance between the source electrode layer 160 and the drain electrode layer 170 using the gate structure 11.

The substrate 101, in an example, may include a semiconductor material, an insulating material, or a conductive material. The substrate 101 may be a silicon (Si) substrate, a gallium arsenide (GaAs) substrate, an indium phosphide (InP) substrate, a germanium (Ge) substrate, a silicon germanium (SiGe) substrate, or a silicon on insulator (SOI) substrate, as non-limiting examples. In another example, the substrate 101 may be a sapphire substrate, a quartz substrate, or a glass substrate. The substrate 101 may, for example, be a conductive substrate such as a doped semiconductor substrate or a metal substrate.

The indium-gallium-zinc oxide layer 120 may be disposed on the substrate 101. As an example, the indium-gallium-zinc oxide layer 120 may have a c-axis aligned (in reference to crystallographic a-b-c reference axes) crystal structure. In an embodiment, the indium-gallium-zinc oxide layer 120 may be deposited in a crystalline structure by a direct current (DC) or an alternating current (AC) sputtering method. In an example, the indium-gallium-zinc oxide layer 120 may be deposited by a sputtering method using a single metal oxide target, or a reactive sputtering method using multiple metal targets. In another embodiment, the indium-gallium-zinc oxide layer 120 may be deposited as a crystalline, partially crystalline, or amorphous thin film by a chemical vapor deposition method or an atomic layer deposition method. If the crystallinity formed during a deposition process is not sufficient, an additional heat treatment may be performed to increase the degree of crystallization of the indium-gallium-zinc oxide layer 120.

The indium-gallium-zinc oxide layer 120 may act as an active layer of the ferroelectric memory device 10. Charge can be induced in the indium-gallium-zinc oxide layer 120 under the gate structure 11 by remanent polarization orientation of the ferroelectric material layer 145. The region of the charge-induced indium-gallium-zinc oxide layer 120 may function as a channel region of the ferroelectric memory device 10. Depending on the density of the induced charges, the electrical resistance of the channel region may vary.

In an example, when the indium-gallium-zinc oxide layer 120 acts as an active layer of a field effect transistor, the indium-gallium-zinc oxide layer 120 can have substantially the same level of turn-on current as compared with a conventional silicon active layer, but a very low level of turn-off current as compared with a conventional silicon active layer. Accordingly, the indium-gallium-zinc oxide layer 120 can increase the distribution range of the channel resistance that can be realized in the channel region when used in combination with a ferroelectric material layer.

In an embodiment of the present disclosure, the number of channel resistance states identified or measured in the channel region can be increased by increasing the distribution range of the channel resistance. Therefore, the number of remanent polarization orientation states differentiated from one another in the ferroelectric material layer 145 may increase as the number of the channel resistance states increase. The channel resistance states may correspond to the remanent polarization orientation states stored in the ferroelectric material layer 145 in a read operation of the ferroelectric memory device 10. Also, when implementing the same number of channel resistance states as in a conventional silicon active layer, a sensing margin for distinguishing different channel resistance states can be increased with an increase in the distribution range of the channel resistance. Therefore, remanent polarization orientation states stored in the ferroelectric material layer 145 corresponding to the channel resistance states may be effectively identified in the read operation. As a result, more reliable multilevel information corresponding to multilevel remanent polarization orientation states can be implemented in the ferroelectric memory device 10.

The interlayer insulation layer 110 may be disposed between the substrate 101 and the indium-gallium-zinc oxide layer 120. The interlayer insulation layer 110 may include an insulative material. The interlayer insulation layer 110 may include silicon oxide, silicon nitride, silicon oxynitride, aluminum oxide or the like, as non-limiting examples. The interlayer insulation layer 110 may have an amorphous crystalline structure.

In an example, when the substrate 101 includes a semiconductor or conductive material, the interlayer insulation layer 110 may serve to prevent charge conduction between the indium-gallium-zinc oxide layer 120 and the substrate 101. As a result, leakage current in the direction of the substrate 101 can be suppressed, and channel conduction characteristics can be improved. In some embodiments, when the substrate 101 includes an insulative material, the interlayer insulation layer 110 may be omitted.

The gate structure 11 may include a gate dielectric layer 135, a ferroelectric material layer 145 and a gate electrode layer 155. The gate dielectric layer 135 may be disposed on the indium-gallium-zinc oxide layer 120. The gate dielectric layer 135 may be disposed between the indium-gallium-zinc oxide layer 120 and the ferroelectric material layer 145 to suppress conduction of charge between the indium-gallium-zinc oxide layer 120 and the ferroelectric material layer 145.

The gate dielectric layer 135 may include silicon oxide, silicon nitride, or silicon oxynitride, as non-limiting examples. The gate dielectric layer 135 may have, for example, a thickness of approximately 10 Angstroms (Å) to 50 Å.

The ferroelectric material layer 145 may be disposed on the gate dielectric layer 135. The ferroelectric material layer 145 may have remanent polarization therein. The remanent polarization can induce charges in the indium-gallium-zinc oxide layer 120 adjacent the gate dielectric layer 135. The degree of orientation of the remanent polarization can be controlled by the polarity and magnitude of the bias applied to the gate electrode layer 155 along the hysteresis curve of the ferroelectric material layer 145.

The ferroelectric material layer 145 may include oxide of hafnium or zirconium, or a perovskite material, as non-limiting examples. The ferroelectric material layer 145 may include $HfO_2$, $ZrO_2$, $Hf_{0.5}Zr_{0.5}O_2$, $PbZr_xTi_{1-x}O_3$ (0<x<1, PZT), Ba(Sr, Ti)$O_3$ (BST), $Bi_{4-x}La_xTi_3O_{12}$ (0<x<1, BLT), $SrBi_2Ta_2O_9$ (SBT), $Pb_5Ge_5O_{11}$ (PGO), $SrBi_2Nb_2O_9$ (SBN) and $YMnO_3$, or a combination of two or more thereof, as non-limiting examples.

In an embodiment, the ferroelectric material layer 145 may include doped $HfO_2$, doped $ZrO_2$, doped $Hf_{0.5}Zr_{0.5}O_2$, or a combination of two or more thereof, as non-limiting examples. The ferroelectric material layer 145 may include, as a dopant, carbon, silicon, magnesium, aluminum, yttrium, nitrogen, germanium, tin, strontium, lead, calcium, barium, titanium, gadolinium, lanthanum, or a combination of two or more thereof, as non-limiting examples.

In an embodiment, when the ferroelectric material layer 145 includes $HfO_2$, $ZrO_2$, $Hf_{0.5}Zr_{0.5}O_2$, or a combination of two or more thereof, the ferroelectric material layer 145 may have a thickness of about five nanometers (5 nm) to twenty nanometers (20 nm). In another embodiment, when the ferroelectric material layer 145 includes a perovskite material, the ferroelectric material layer 145 may have a thickness of about thirty nanometers (30 nm) to one hundred nanometers (100 nm).

In an example, the polarity and magnitude of the bias applied to the gate electrode layer 155 during a programming or an erasing operation may be controlled to adjust the degree of orientation of the remanent polarization in the ferroelectric material layer 145. Multilevel signal information corresponding to the degree of orientation of the remanent polarization can be stored in a nonvolatile manner. In the channel region of the indium-gallium-zinc oxide layer 120, different amounts of charges can be induced corresponding to the degree of orientation of the remanent polarization in ferroelectric material layer 145. As a result, in a read operation of the ferroelectric memory device, for example, a plurality of channel resistances, which are differentiated or distinctive from each other, can be identified or measured in the channel region of the indium-gallium-zinc oxide layer 120.

The gate electrode layer 155 may be disposed on the ferroelectric material layer 145. The gate electrode layer 155 may include tungsten, titanium, copper, aluminum, ruthenium, platinum, iridium, iridium oxide, tungsten nitride, titanium nitride, tantalum nitride, tungsten carbide, titanium carbide, tungsten silicide, titanium silicide, tantalum silicide, ruthenium oxide, or a combination of two or more thereof, as non-limiting examples.

Referring to FIG. 1 again, the source electrode layer 160 and the drain electrode layer 170 may be disposed at both ends, or respective sides, of the gate structure 11. The source and drain electrode layers 160 and 170 may each be disposed on the indium-gallium-zinc oxide layer 120 opposite to each other with respect to the channel region under the ferroelectric material layer 145.

More specifically, the source and drain electrode layers 160 and 170 may be disposed to face each other in recessed regions of the indium-gallium-zinc oxide layer 120. The source and drain electrode layers 160 and 170 may include metal, conductive metal nitride, conductive metal silicide, conductive metal carbide, or a combination of two or more thereof, as non-limiting examples.

As described above, a ferroelectric memory device according to an embodiment of the present disclosure may include a ferroelectric material layer 145 disposed on an indium-gallium-zinc oxide layer 120. Depending on the polarity and the magnitude of the write voltage applied to a gate electrode layer 155, a plurality of remanent polarization orientations in the ferroelectric material layer 145 can be implemented. Multilevel signal information corresponding to the orientation state of the remanent polarization can be stored in a nonvolatile manner. In a read operation of the ferroelectric memory device, charges having different densities can be induced in the channel region of the indium-gallium-zinc oxide layer 120, corresponding to the remanent polarization state stored in the ferroelectric material layer 145. A plurality of different channel resistances can be implemented in the channel region according to the induced charge density.

As described above, the indium-gallium-zinc oxide layer 120 may have substantially the same level of turn-on current as that of a conventional silicon active layer, but a very low level of turn-off current as compared with the conventional silicon active layer. Accordingly, the range of distribution of the channel resistance in the channel region of the indium-gallium-zinc oxide layer 120 can be increased.

In an embodiment of the present disclosure, by increasing the distribution range of the channel resistance that can be implemented in the channel region, the numbers of the remanent polarization orientation states, corresponding to the numbers of channel resistance states, can be increased. Further, the sensing margin between different or distinctive channel resistances, which correspond to different remanent polarization orientation states, may be increased. The increased distribution range of the channel resistances can increase discrimination of, or ability to distinguish between, different channel resistances. Thus, a ferroelectric memory device that stores multilevel information in a more reliable manner may be provided.

Figure 2:
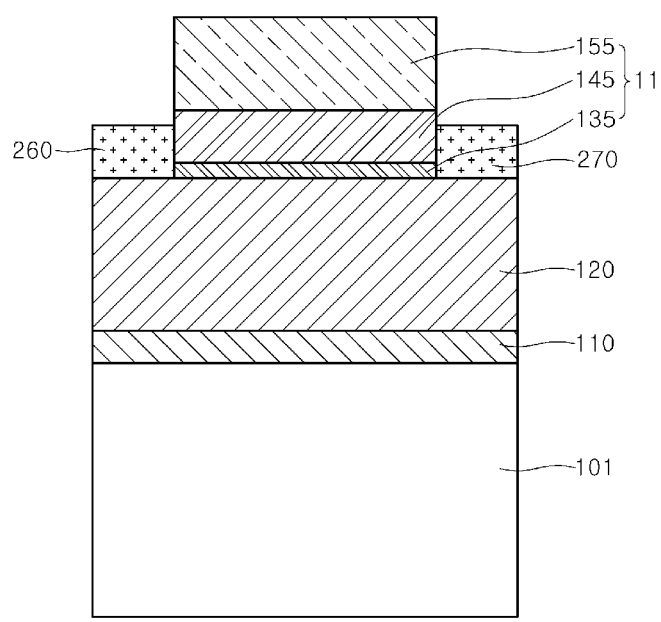
FIG. 2 is a schematic view illustrating a portion of a ferroelectric memory device according to an embodiment of the present disclosure.

FIG. 2 is a schematic view illustrating a portion of a ferroelectric memory device according to an embodiment of the present disclosure. Referring to FIG. 2, ferroelectric memory device 20 may have substantially the same configuration as that of the ferroelectric memory device 10 described above and with reference to FIG. 1, except that a source electrode layer 260 and a drain electrode layer 270 are disposed on an indium-gallium-zinc oxide layer 120, at respective sides of gate structure 11.

Upper surfaces of the source electrode layer 260 and the drain electrode layer 270 may be disposed below an interface of a ferroelectric material layer 145 and a gate electrode layer 155 in order to prevent an electrical short between the gate electrode layer 155 and the source electrode layer 260, and between the gate electrode layer 155 and the drain electrode layer 270.

Figure 3:
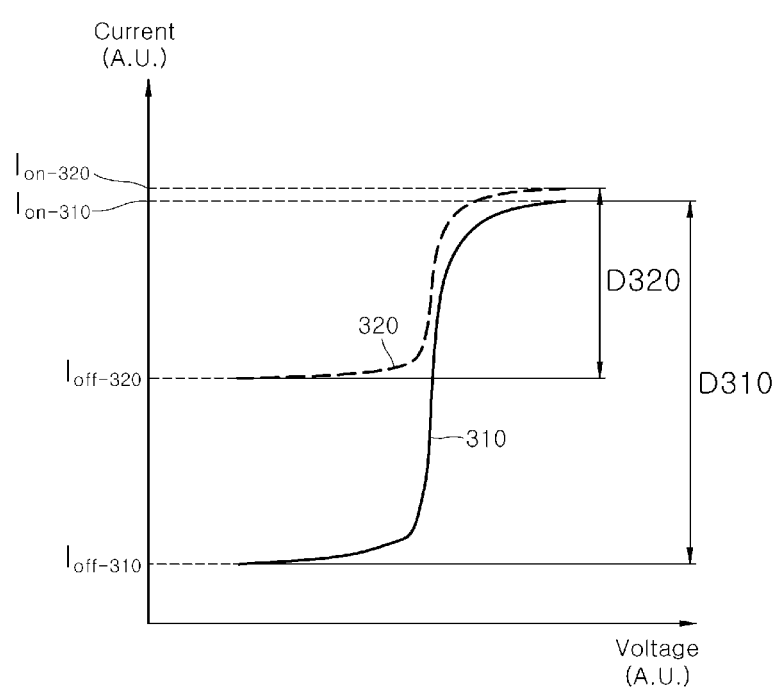
FIG. 3 is a graphic illustrating channel currents in active layers of field effect transistors.

FIG. 3 is a graph illustrating channel currents in active layers of field effect transistors. The field effect transistor may be a conventional transistor that functions as an electrical switch. A first graph 310 of FIG. 3 illustrates the on-off current in a first case where a crystalline indium-gallium-zinc oxide layer (C-axis aligned crystalline In—Ga—Zn oxide, CAAC-IGZO) is utilized as an active layer of the transistor, and a second graph 320 illustrates the on-off current in a second case where a single crystal silicon layer is utilized as the active layer of the transistor.

As an example, S. Yamazaki, et al. (2014 Jpn. J. Appl. Phys. 53 04ED18) report that where a crystalline indium-gallium-zinc oxide layer (C-axis aligned crystalline In—Ga—Zn oxide, CAAC-ICZO) is used as an active layer of the transistor, a turn-off current of less than $10^{-22}$ amperes/micrometer (A/μm) is measured at 85 degrees Celcius (° C.), and it is predicted that it will have a turn-off current of about $10^{-24}$ A/μm or less. The turn-off current of a conventional transistor employing a silicon active layer is generally known to be about $10^{-14}$ A/μm. Thus, the turn-off current of a transistor employing a C-axis aligned crystalline indium-gallium-zinc oxide layer as the active layer is about $10^{10}$ times lower than that of a transistor employing a silicon active layer.

Further, according to S. Yamazaki, et al. (2014 Jpn. J. Appl. Phys. 53 04ED18), a turn-on current of about $10^{-3}$ A/μm is measured when the C-axis aligned crystalline indium-gallium-zinc oxide layer is used as the active layer of the field effect transistor. S. Yamazaki, et al., 2014 Jpn. J. Appl. Phys. 53 04ED18, is herein incorporated by reference in its entirety into the present disclosure.

Referring again to FIG. 3, in measuring the current flowing along the channel of the field effect transistor, the first graph 310 may have a first turn-off current $I_{off\text{-}310}$ and a first turn-on current $I_{on\text{-}310}$, and the second graph 320 may have a second turn-off current $I_{off\text{-}320}$ and a second turn-on current $I_{on\text{-}320}$. Assuming that the first graph 310 and the second graph 320 may have substantially the same level of turn-on current $I_{on}$, the first graph 310 and the second graph 320 may have a first channel current distribution range D310 and a second channel current distribution range D320, respectively. Here, the first channel current distribution range D310 may indicate a difference between the first turn-on current $I_{on\text{-}310}$ and the first turn-off current $T_{off\text{-}310}$, and the second channel current distribution range D320 may indicate a difference between the second turn-on current $I_{on\text{-}320}$ and the second turn-off current $T_{off\text{-}320}$.

As an example, the first channel current distribution range D310 may have a distribution range of channel current that is about $10^{10}$ times greater than the second channel current distribution range D320. Accordingly, when the crystalline indium-gallium-zinc oxide layer is utilized as the active layer of the ferroelectric memory device of the present disclosure, the potential number of current levels in the channel region corresponding to the remanent polarization orientation states stored in the ferroelectric material layer is increased, and the plurality of current levels may be detected or distinguished by larger sensing margins in a larger channel current distribution range D310.

Figure 4:
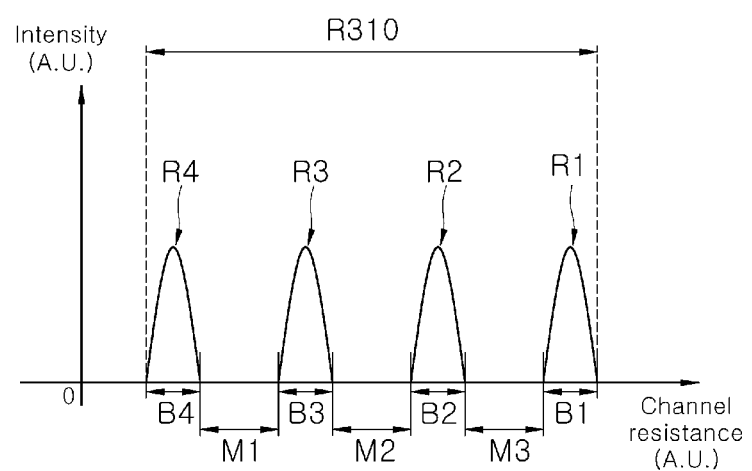
FIG. 4 is a graphic illustrating a multilevel resistance state in a ferroelectric memory device according to an embodiment of the present disclosure.

FIG. 4 is a graphic illustrating a multilevel resistance state in a ferroelectric memory device according to an embodiment of the present disclosure. Referring to FIG. 4, the ferroelectric memory device may implement a distribution range R310 of a predetermined channel resistance state between a turn-off current and a turn-on current. The distribution range R310 of the channel resistance state corresponds to and is derived from the distribution range D310 of the first channel current shown with reference to FIG. 3.

Referring to FIG. 4, the ferroelectric memory device may implement first to fourth channel resistance states R1, R2, R3 and R4 in a read operation. Each of the first to fourth channel resistance states R1, R2, R3 and R4 may have corresponding first to fourth band widths B1, B2, B3 and B4. The first to fourth channel resistance states R1, R2, R3 and R4 may have first to third band intervals M1, M2 and M3 between adjacent channel resistance states. In FIG. 4, the number of the channel resistance states, band widths, and band intervals are schematically simplified for convenience of description, but embodiments of the present disclosure are not limited thereto.

In an example, an indium-gallium-zinc oxide layer is used as an active layer in a ferroelectric memory device. The ferroelectric memory device has a larger distribution range of channel current and a larger distribution range of channel resistance states compared to a memory device using a conventional silicon layer as the active layer. Accordingly, the number of channel resistance states within the distribution range R310 of the channel resistance states can be increased in the ferroelectric memory device using an indium-gallium-zinc oxide active layer. In other words, the number of multilevel signal information that can be written in the ferroelectric memory device can be increased by implementing the remanent polarization orientation states corresponding to the increased number of channel resistance states.

In another example, the number of channel resistance states in a ferroelectric memory device using an indium-gallium-zinc oxide active layer is the same as that in a conventional device using a silicon active layer. In this case, the channel resistances of the ferroelectric memory device can be arranged such that band intervals between the channel resistances are larger as compared to those of a conventional device because the distribution range R310 of the channel resistance states is larger. As a result, sensing margins for discriminating or distinguishing between a plurality of channel resistance states, which correspond to a plurality of remanent polarization orientations stored in the ferroelectric material layer, are enlarged. Thus, multilevel information can be stored and identified more reliably in a ferroelectric memory device as compared to conventional devices.

FIGS. 5 to 8 are schematic views illustrating operations storing a multilevel signal in a ferroelectric memory device according to embodiments of the present disclosure. The ferroelectric memory devices 30 of FIGS. 5 to 8 may store multilevel signals having a first to fourth remanent polarization states S1, S2, S3 and S4 corresponding to a first to fourth channel resistance states R1, R2, R3 and R4, respectively. In an embodiment, a ferroelectric memory device 30 of FIGS. 5 to 8 may be a ferroelectric memory device that is substantially the same as the ferroelectric memory device 10 of an embodiment described above and with reference to FIGS. 1, 3 and 4. In another embodiment, the operations disclosed herein and with reference to FIGS. 5 to 8 may be performed using a ferroelectric memory device that is substantially the same as the ferroelectric memory device 20 of an embodiment described above and with reference to FIGS. 2 to 4. In the figures, a downwardly oriented polarization is illustrated as $P_{down}$ and an upwardly oriented polarization is illustrated as $P_{up}$. Furthermore, for convenience of explanation, the illustration of substrate 101 and interlayer insulation layer 110 are omitted in FIGS. 5 to 8.

Figure 5:
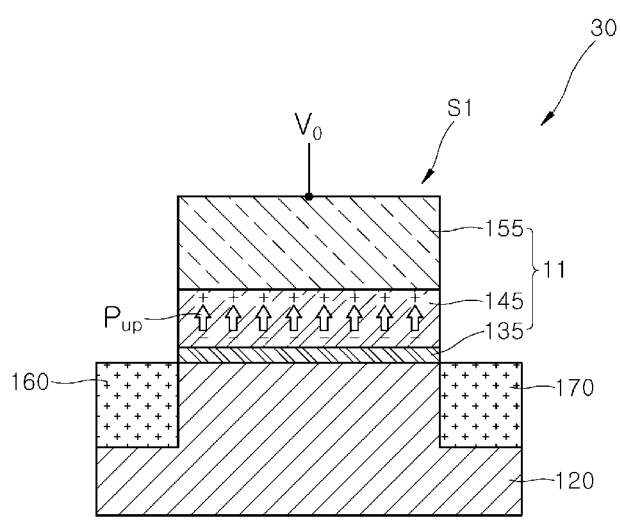
FIGS. 5 to 8 are schematic views illustrating operations storing a multilevel signal in a ferroelectric memory device according to embodiments of the present disclosure.

Referring to FIG. 5, in an embodiment, an erase voltage $V_0$ may be applied to a gate electrode layer 155 of the ferroelectric memory device 30. The erase voltage $V_0$ may be applied so that the gate electrode layer 155 has a relatively negative electric potential compared to the potential of an indium-gallium-zinc oxide layer 120 or a source electrode layer 160. The erase voltage $V_0$ can orient the polarization in substantially all of a ferroelectric material layer 145 in an upward orientation. Accordingly, a first remanent polarization orientation state S1 stores a first level information in the ferroelectric memory device 30 in a nonvolatile manner.

Figure 6:
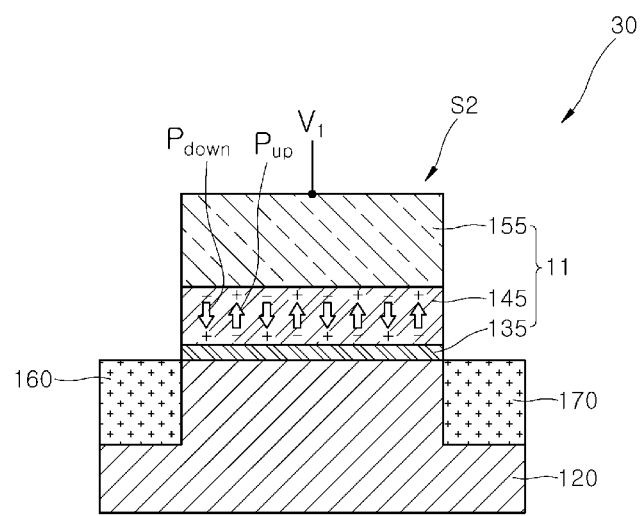

Referring to FIG. 6, a first programming voltage $V_1$ may be applied to the gate electrode layer 155 of the ferroelectric memory device 30. The first programming voltage $V_1$ may be applied so that the gate electrode layer 155 has a relatively positive electric potential compared to the potential of the indium-gallium-zinc oxide layer 120 or the source electrode layer 160. The first programming voltage $V_1$ may convert or switch the orientation of the polarization within a portion or fraction of the ferroelectric material layer 145 in a downward orientation. Accordingly, a second remanent polarization orientation state S2 stores a second level information in the ferroelectric memory device 30 in a nonvolatile manner.

Figure 7:
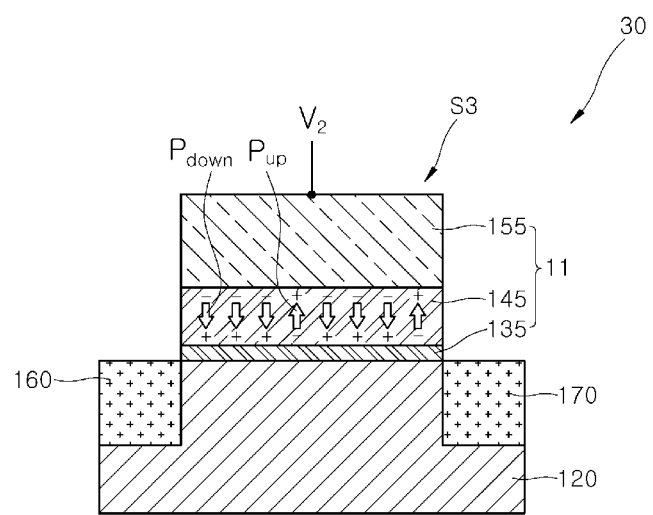

Referring to FIG. 7, a second programming voltage $V_2$ may be applied to the gate electrode layer 155 of the ferroelectric memory device 30. The second programming voltage $V_2$ may be applied so that the gate electrode layer 155 has a relatively positive electric potential compared to the potential of the indium-gallium-zinc oxide layer 120 or the source electrode layer 160. The second programming voltage $V_2$ may convert or switch the orientation of the polarization within a portion or fraction of the ferroelectric material layer 145 downward. The second programming voltage $V_2$ may be greater than the first programming voltage $V_1$ of FIG. 6. Accordingly, the degree of the downward orientation of the polarization in the ferroelectric material layer 145 may be greater than the degree of orientation in the layer when the first programming voltage V1 is applied. As shown in the figure, a greater portion or fraction of the ferroelectric material layer 145 is oriented downward compared to second remanent polarization orientation state S2, while a smaller portion or fraction of the polarization is oriented upward compared to second remanent polarization orientation state S2. Accordingly, a third remanent polarization orientation state S3 stores a third level information in the ferroelectric memory device 30 in a nonvolatile manner.

Figure 8:
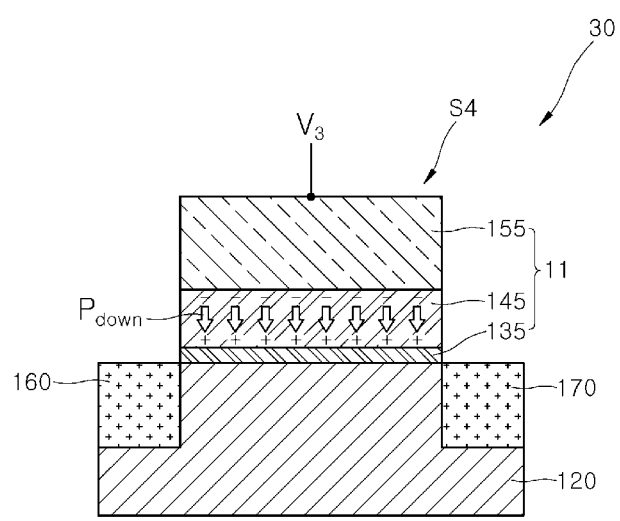

Referring to FIG. 8, a third programming voltage $V_3$ may be applied to the gate electrode layer 155 of the ferroelectric memory device 30. The third programming voltage $V_3$ may be applied so that the gate electrode layer 155 has a relatively positive electric potential compared to the potential of the indium-gallium-zinc oxide layer 120 or the source electrode layer 160. The third programming voltage $V_3$ may convert or switch the orientation of the polarization within substantially all the ferroelectric material layer 145 in a downward orientation. Accordingly, a fourth remanent polarization orientation state S4 stores a fourth level information in the ferroelectric memory device 30 in a nonvolatile manner.

FIGS. 9 to 12 are schematic views illustrating operations reading a multilevel signal in a ferroelectric memory device according to embodiments of the present disclosure. The ferroelectric memory devices 30 of FIGS. 9 to 12 may implement the first to fourth channel resistance states R1, R2, R3 and R4 corresponding to the first to fourth remanent polarization states S1, S2, S3 and S4, respectively, as described above and with reference to FIGS. 5 to 8. In an embodiment, a ferroelectric memory device 30 of FIGS. 9 to 12 may be a ferroelectric memory device that is substantially the same as the ferroelectric memory device 10 of an embodiment described above and with reference to FIGS. 1, 3 and 4. In another embodiment, the operations disclosed herein and with reference to FIGS. 9 to 12 may be performed using a ferroelectric memory device that is substantially the same as the ferroelectric memory device 20 of an embodiment described above and with reference to FIGS. 2 to 4. In the figures, a downwardly oriented polarization is illustrated as $P_{down}$ and an upwardly oriented polarization is illustrated as $P_{up}$. Furthermore, for convenience of explanation, the illustration of substrate 101 and interlayer insulation layer 110 are omitted in FIGS. 9 to 12.

Referring to FIGS. 9 to 12, a read voltage $V_R$ is applied to the gate electrode layer 155, and a source voltage $V_S$ and a drain voltage $V_D$ are applied to the source electrode layer 160 and the drain electrode layer 170, respectively, to perform a read operation of the ferroelectric memory device 30. As an example, the read voltage $V_R$ and the drain voltage $V_D$ may be greater than the source voltage $V_S$.

Figure 9:
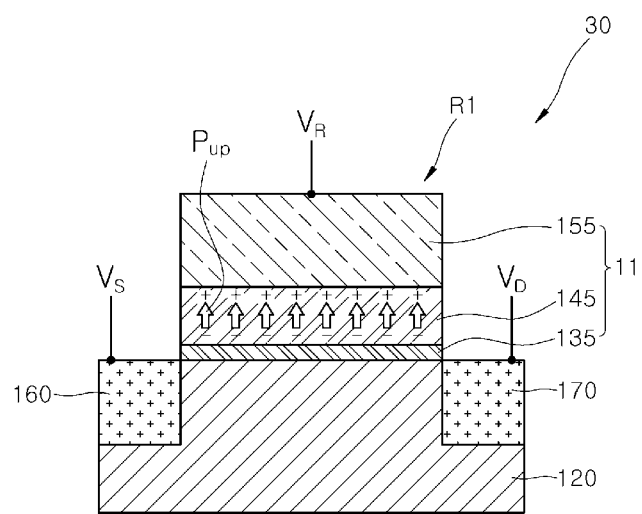
FIGS. 9 to 12 are schematic views illustrating operations reading a multilevel signal in a ferroelectric memory device according to embodiments of the present disclosure.

Referring to FIG. 9, in an embodiment, the first remanent polarization state S1 is implemented, and the upward polarization orientation in the ferroelectric material layer 145 results in electrons depleted in the channel region located in the indium-gallium-zinc oxide layer 120 below the gate dielectric layer 135. Electrons may be depleted in the channel region in a first channel resistance state R1. The first channel resistance state R1 may be the substantially highest resistance state implemented in the channel region. As an example, the first channel resistance state R1 may correspond to a turned-off state in which only leakage current flows between the source electrode layer 160 and the drain electrode layer 170.

Figure 10:
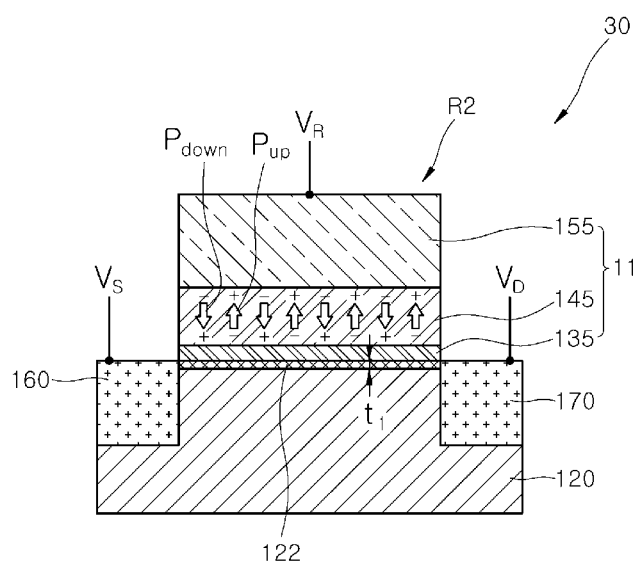

Referring to FIG. 10, when a read voltage $V_R$ is applied to the gate electrode layer 155 of the ferroelectric memory device 30 in the second remanent polarization state S2, electrons are induced in the channel region of the indium-gallium-zinc oxide layer 120 by the portion or fraction of the ferroelectric material layer 145 having a downwardly oriented polarization, in contrast to the first remanent polarization state S1 in FIG. 9. A channel layer 122 may be formed between the source electrode layer 160 and the drain electrode layer 170 having a first thickness t1 and the induced electrons. Accordingly, a second channel resistance state R2 can be implemented having a relatively lower channel resistance as compared to that of the first channel resistance state R1.

Figure 11:
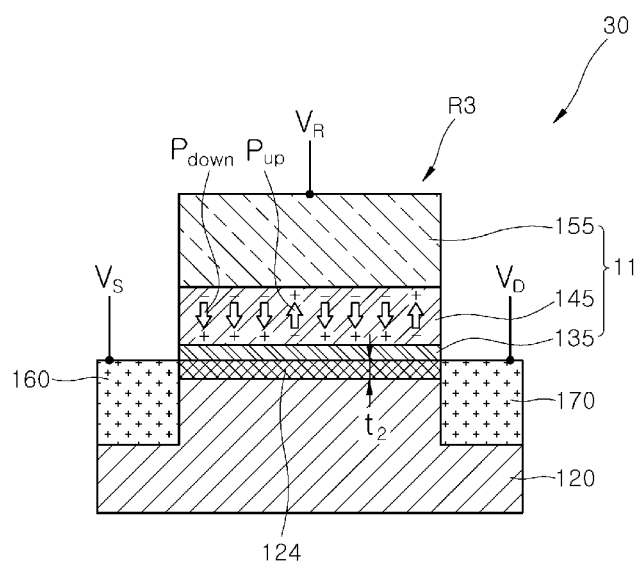

Referring to FIG. 11, when a read voltage $V_R$ is applied to the gate electrode layer 155 of the ferroelectric memory device 30 in the third remanent polarization state S3, the number of electrons induced in the channel region of the indium-gallium-zinc oxide layer 120 increases compared to that of the second remanent polarization state S2 and FIG. 10. The portion, ratio or fraction of the ferroelectric material layer 145 having a downwardly oriented polarization is larger, and therefore a larger channel layer 124 having a greater thickness t2 and the induced electrons can be formed between the source electrode layer 160 and the drain electrode layer 170 by the induced electrons. Thickness t2 is larger than thickness t1 of FIG. 10. Accordingly, a third channel resistance state R3 can be implemented having a relatively lower channel resistance as compared with that of the second channel resistance state R2.

Figure 12:
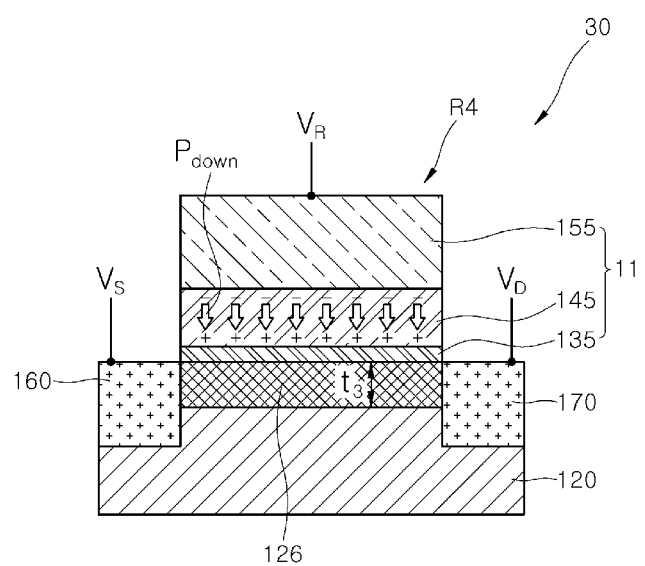

Referring to FIG. 12, when a read voltage $V_R$ is applied to the gate electrode layer 155 of the ferroelectric memory device 30 in the fourth remanent polarization state S4, the number of electrons induced in the channel region of the indium-gallium-zinc oxide layer 120 may further be increased as substantially all of the ferroelectric material layer 145 has a downwardly oriented polarization. A channel layer 126 can be formed between the source electrode layer 160 and the drain electrode layer 170 having a third thickness t3 and the induced electrons. Thickness t3 is larger than thickness t2 of FIG. 11. Accordingly, a fourth channel resistance state R4 can be implemented having a relatively lower resistance as compared with that of the third channel resistance state R3. The fourth channel resistance state R4 may be substantially the lowest resistance state implemented in the channel region.

As described above, in an embodiment, an indium-gallium-zinc oxide layer having a relatively wide channel resistance range as compared with a silicon layer can be utilized as an active layer. Charges of different densities are induced in a channel region in the active layer depending on the degree of a remanent polarization orientation stored in a ferroelectric material layer, so that the ferroelectric memory device can reliably implement multilevel information.

Figure 13:
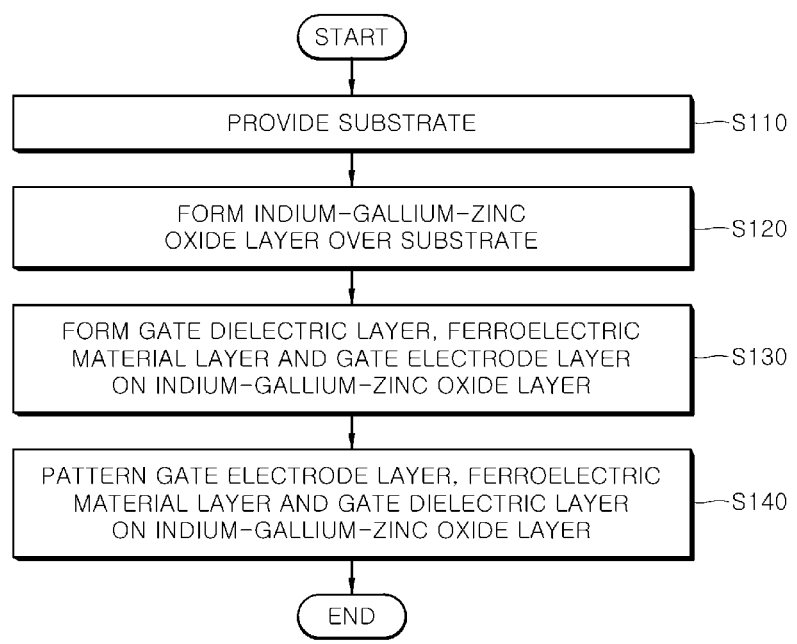
FIG. 13 is a flow chart illustrating a method of manufacturing a ferroelectric memory device according to an embodiment of the present disclosure.

FIG. 13 is a flow chart illustrating a method of manufacturing a ferroelectric memory device according to an embodiment of the present disclosure. FIGS. 14 to 18 are schematic views illustrating a method of manufacturing a ferroelectric memory device according to an embodiment of the present disclosure. Referring to S110 of FIG. 13 and FIG. 14, a substrate 101 is provided. The substrate 101 may include a semiconductor material, an insulative material, or a conductive material. The substrate 101 may be a silicon (Si) substrate, a gallium arsenide (GaAs) substrate, an indium phosphide (InP) substrate, a germanium (Ge) substrate, a silicon germanium (SiGe) substrate, or a silicon-on-insulator (SOI) substrate, as non-limiting examples. The substrate 101 may be, in another example, a sapphire substrate, a quartz substrate, or a glass substrate. The substrate 101 may be, for another example, a conductive substrate such as a doped semiconductor substrate or a metal substrate.

Figure 14:
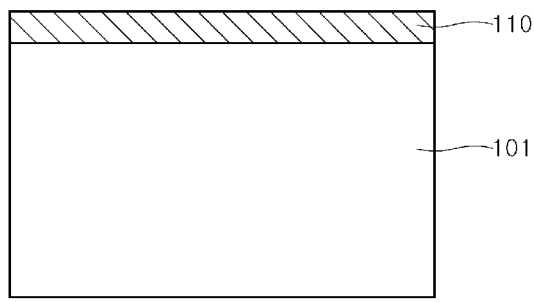
FIGS. 14 to 18 are schematic views illustrating a method of manufacturing a ferroelectric memory device according to an embodiment of the present disclosure.

As illustrated in FIG. 14, an interlayer insulation layer 110 is formed on the substrate 101. The interlayer insulation layer 110 may include an insulative material. The interlayer insulation layer 110 may include silicon oxide, silicon nitride, silicon oxynitride, aluminum oxide or the like, as non-limiting examples. The interlayer insulation layer 110 may have an amorphous structure. The interlayer insulation layer 110 may be formed by applying a chemical vapor deposition method, a thermal oxidation method or the like, as non-limiting examples. In some embodiments, when substrate 101 is an insulative substrate, the interlayer insulation layer 110 may be omitted.

Figure 15:
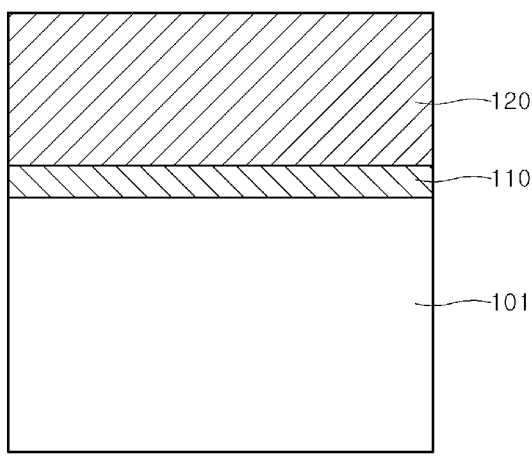

Referring to S120 of FIG. 13 and FIG. 15, an indium-gallium-zinc oxide layer 120 is formed on the interlayer insulation layer 110. The indium-gallium-zinc oxide layer 120 may have a C-axis aligned (in reference to crystallographic a-b-c reference axes) crystalline structure. In an embodiment, the indium-gallium-zinc oxide layer 120 may be formed to have a crystalline structure using a DC or an AC sputtering method. For an example, the indium-gallium-zinc oxide layer 120 may be formed by a sputtering method using a single metal oxide target or a reactive sputtering method using a plurality of metal targets. In another embodiment, the indium-gallium-zinc oxide layer 120 may be formed to have a crystalline structure or an amorphous structure by a chemical vapor deposition method or an atomic layer deposition method. Thereafter, an additional heat treatment may be performed to crystallize the indium-gallium-zinc oxide layer 120. The heat treatment may be performed in an oxygen atmosphere or an inert gas atmosphere.

Figure 16:
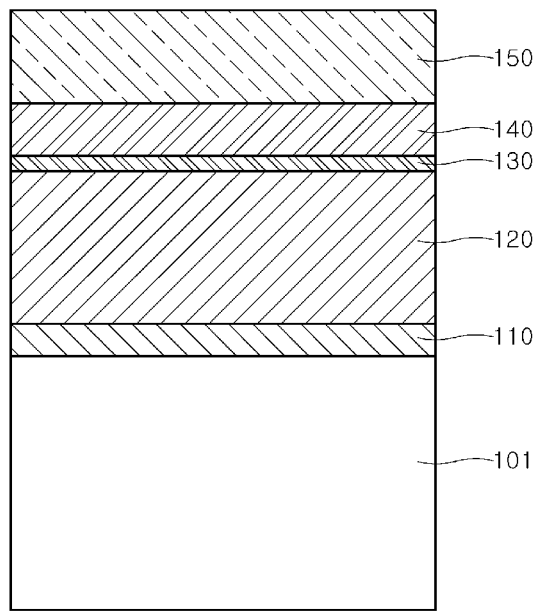

Referring to S130 of FIG. 15 and FIG. 16, a gate dielectric layer 130, a ferroelectric material layer 140, and a gate electrode layer 150 are formed. The gate dielectric layer 130 is formed on the indium-gallium-zinc oxide layer 120 and may include silicon oxide, silicon nitride, or silicon oxynitride, as non-limiting examples. The gate dielectric layer 130 may, for example, have a thickness of about 10 Å to 50 Å. The gate dielectric layer 130 may be formed using a chemical vapor deposition method, an atomic layer deposition method or the like, as non-limiting examples.

The ferroelectric material layer 140 is formed on gate dielectric layer 130, and may include oxide of hafnium or zirconium, or a perovskite-based material, as non-limiting examples. The ferroelectric material layer 140 may be formed using chemical vapor deposition method or an atomic layer deposition method, as non-limiting examples.

In an embodiment, the ferroelectric material layer 140 may include $HfO_2$, $ZrO_2$, $Hf_{0.5}Zr_{0.5}O_2$, or a combination of two or more thereof, as non-limiting examples. The ferroelectric material layer 145 may include, as a dopant, carbon, silicon, magnesium, aluminum, yttrium, nitrogen, germanium, tin, strontium, lead, calcium, barium, titanium, gadolinium, lanthanum, or a combination of two or more thereof, as non-limiting examples. The ferroelectric material layer 140 may have a thickness of about five (5) nm to 20 nm.

In another embodiment, the ferroelectric material layer 140 may include $PbZr_xTi_{1-x}O_3$ (0<x<1, PZT), $Ba(Sr, Ti)O_3$ (BST), $Bi_{4-x}La_xTi_3O_{12}$ (0<x<1, BLT), $SrBi_2Ta_2O_9$ (SBT), $Pb_5Ge_5O_{11}$ (PGO), $SrBi_2Nb_2O_9$ (SBN) and $YMnO_3$, or a combination of two or more thereof, as non-limiting examples. Here, the ferroelectric material layer 140 may have a thickness of about 30 nm to 100 nm.

The gate electrode layer 150 is formed on ferroelectric layer 140 and may include tungsten, titanium, copper, aluminum, ruthenium, platinum, iridium, iridium oxide, tungsten nitride, titanium nitride, tantalum nitride, tungsten carbide, titanium carbide, tungsten silicide, titanium silicide, tantalum silicide, ruthenium oxide, or a combination of two or more thereof, as non-limiting examples. The gate electrode layer 150 may, for example, be formed using a chemical vapor deposition method, an atomic layer deposition method, a sputtering method.

Figure 17:
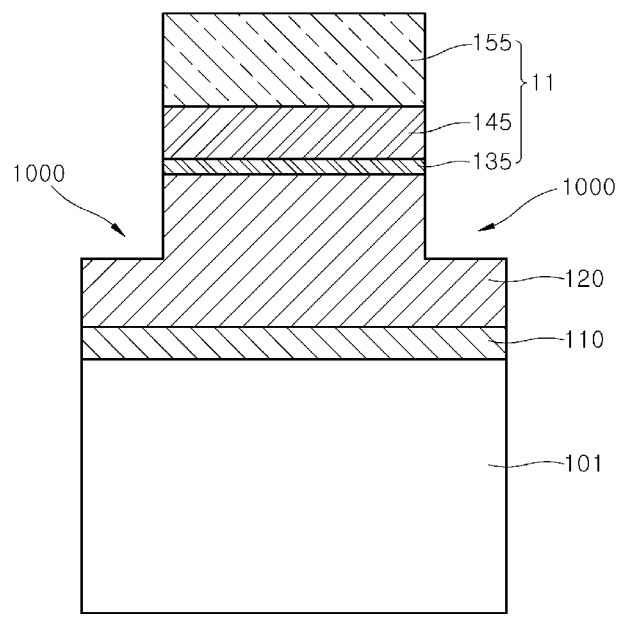

Referring to S140 of FIG. 13 and FIG. 17, the gate electrode layer 150, the ferroelectric material layer 140 and the gate dielectric layer 130 are patterned to form a gate structure 11. After patterning, the gate structure 11 may include a gate dielectric layer 135, a ferroelectric material layer 145 and a gate electrode layer 155.

A trench 1000 is formed, during or after the patterning process, by selectively recessing the indium-gallium-zinc oxide layer 120. The trench 1000 may be formed at both ends, or respective sides, of the gate structure 11. The depth of the trench 1000 may be about one-tenth (1/10) to one-half (1/2) the thickness of the indium-gallium-zinc oxide layer 120.

Figure 18:
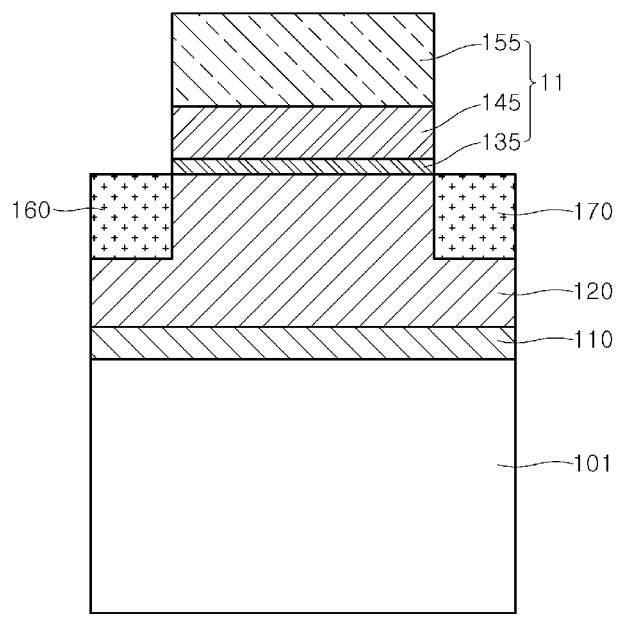

Referring to FIG. 18, the trench 1000 is filled with a conductive material to form a source electrode layer 160 and a drain electrode layer 170. The conductive material may include metal, conductive metal nitride, conductive metal silicide, conductive metal carbide, or a combination of two or more thereof, as non-limiting examples.

Then, the conductive material may be further flattened or subject to a planarization process so that surfaces of the source and drain electrode layers 160 and 170 are located on substantially the same plane as a surface of the indium-gallium-zinc oxide layer 120. As an example, an etch-back process may be used as a planarization process. As a result, the thickness of the source electrode layer 160 and the drain electrode layer 170 may be one-tenth (1/10) to one-half (1/2) the thickness of the indium-gallium-zinc oxide layer 120.

By proceeding with the above-described processes, a ferroelectric memory device according to an embodiment of the present disclosure can be manufactured.

Figure 19:
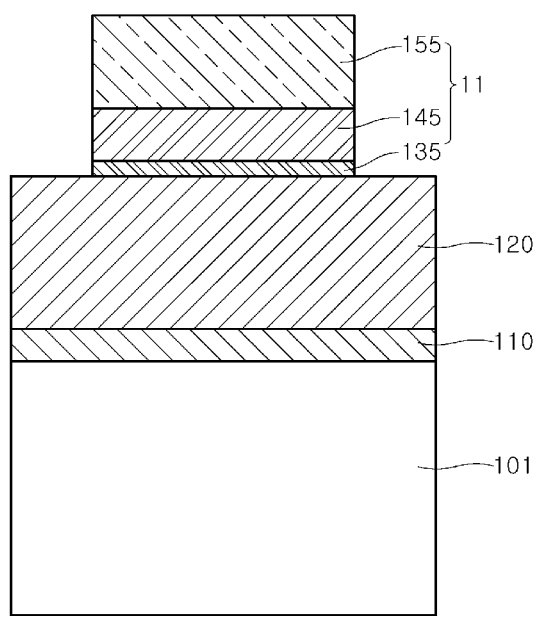
FIGS. 19 and 20 are schematic views illustrating a method of manufacturing a ferroelectric memory device according to an embodiment of the present disclosure.
Figure 20:
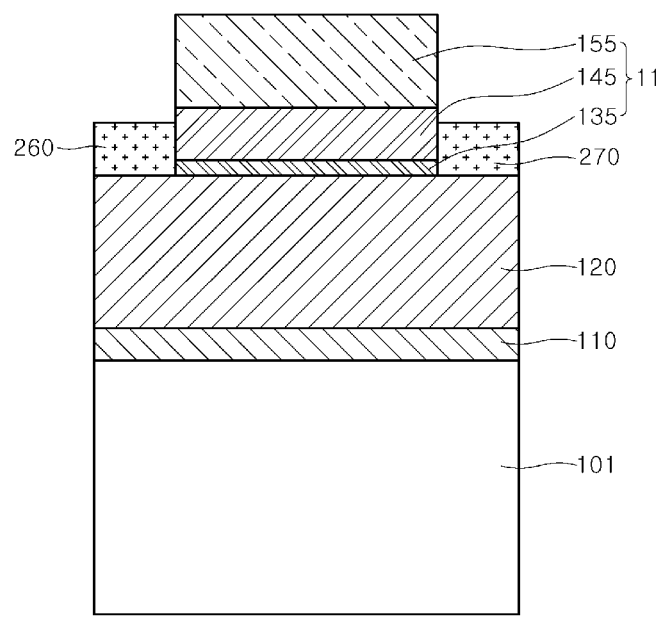

FIGS. 19 and 20 are schematic views illustrating a method of manufacturing a ferroelectric memory device according to an embodiment of the present disclosure. FIG. 19 illustrates an intermediate structure of a portion of a ferroelectric memory device. The intermediate structure may be formed by patterning a gate electrode layer 150, a ferroelectric material layer 140 and a gate dielectric layer 130 after performing the processes of the embodiments described above and with reference to FIGS. 14 to 16 to form a gate structure 11 on an indium-gallium-zinc oxide layer 120.

Referring FIG. 20, a conductive material pattern may be formed on the indium-gallium-zinc oxide layer 120 at both ends, or respective sides, of the gate structure 11. A source electrode layer 260 and a drain electrode layer 270 may be formed using the conductive material pattern.

In this embodiment, upper surfaces of the source electrode layer 260 and the drain electrode layer 270 may be disposed below an interface between the ferroelectric material layer 145 and the gate electrode layer 155 in order to prevent an electrical short between the gate electrode layer 155 and the source electrode layer 260, and between the gate electrode layer 155 and the drain electrode layer 270. Thus, the thickness of the source electrode layer 260 and the drain electrode layer 270 may each be less than the sum of the thicknesses of the gate electrode layer 135 and the ferroelectric material layer 145.

By proceeding with the above-described processes, a ferroelectric memory device according to an embodiment of the present disclosure can be manufactured.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:
1. A ferroelectric memory device comprising:
 a substrate;
 an indium-gallium-zinc oxide layer disposed on the substrate;
 a ferroelectric material layer disposed on the indium-gallium-zinc oxide layer;
 a gate electrode layer disposed on the ferroelectric material layer; and
 a source electrode layer disposed in a first trench recessed in the indium-gallium-zinc oxide at a first end of the gate electrode and a drain electrode layer disposed in a second trench recessed in the indium-gallium-zinc oxide at a second end of the gate electrode.

2. The ferroelectric memory device of claim 1, wherein the indium-gallium-zinc oxide layer has a C-axis aligned crystal structure.

3. The ferroelectric memory device of claim 1, further comprising
 a gate dielectric layer disposed between the indium-gallium-zinc oxide layer and the ferroelectric material layer.

4. The ferroelectric memory device of claim 3, wherein the gate dielectric layer comprises at least one of silicon oxide, silicon nitride, and silicon oxynitride.

5. The ferroelectric memory device of claim 1, wherein the ferroelectric material layer comprises at least one of $HfO_2$, $ZrO_2$, $Hf_{0.5}Zr_{0.5}O_2$, $PbZr_xTi_{1-x}O_3(0<x<1$, PZT), $Ba(Sr, Ti)O_3$ (BST), $Bi_{4-x}La_xTi_3O_{12}(0<x<1$, BLT), $SrBi_2Ta_2O_9$(SBT), $Pb_5Ge_5O_{11}$(PGO), $SrBi_2Nb_2O_9$(SBN) and $YMnO_3$.

6. The ferroelectric memory device of claim 1, wherein the ferroelectric material layer comprises at least one of $HfO_2$, $ZrO_2$, and $Hf_{0.5}Zr_{0.5}O_2$, and at least one dopant selected from carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), gadolinium (Gd), and lanthanum (La).

7. The ferroelectric memory device of claim 1, wherein the gate electrode layer comprises at least one selected from tungsten, titanium, copper, aluminum, ruthenium, platinum, iridium, iridium oxide, tungsten nitride, titanium nitride, tantalum nitride, tungsten carbide, titanium carbide, tungsten silicide, titanium silicide, tantalum silicide, and ruthenium oxide.

8. The ferroelectric memory device of claim 1, wherein each of the source electrode layer and the drain electrode layer comprises at least one selected from metal, conductive metal nitride, conductive metal silicide, and conductive metal carbide.

9. The ferroelectric memory device of claim 1, further comprising
 a channel region disposed in the indium-gallium-zinc oxide layer below the gate electrode layer.

10. The ferroelectric memory device of claim 1, wherein a depth of the trench is between one-tenth and one-half thickness of the indium-gallium-zinc oxide layer.

11. A ferroelectric memory device comprising:
 a substrate;
 an indium-gallium-zinc oxide layer having a C-axis aligned crystal structure and disposed on the substrate;
 an insulation layer disposed on the indium-gallium-zinc oxide layer;
 a ferroelectric material layer disposed on the insulation layer;
 a gate electrode layer disposed on the ferroelectric material layer; and
 a source electrode layer disposed in a first trench recessed in the indium-gallium-zinc oxide at a first end of the gate electrode and a drain electrode layer disposed in a second trench recessed in the indium-gallium-zinc oxide at a second end of the gate electrode, wherein the ferroelectric material layer comprises at least one of HfO2, ZrO2, and Hf0.5Zr0.5O2, and wherein the ferroelectric material layer stores one of a plurality of remanent polarization orientation states in a nonvolatile manner, and wherein the plurality of remanent polarization orientation states correspond to a plurality of program voltages applied to the gate electrode layer.

12. The ferroelectric memory device of claim 11, wherein the ferroelectric material layer comprises at least one dopant selected from carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), gadolinium (Gd), and lanthanum (La).

13. The ferroelectric memory device of claim 11, wherein the gate electrode layer comprises at least one selected from tungsten, titanium, copper, aluminum, ruthenium, platinum, iridium, iridium oxide, tungsten nitride, titanium nitride, tantalum nitride, tungsten carbide, titanium carbide, tungsten silicide, titanium silicide, tantalum silicide, and ruthenium oxide.

14. The ferroelectric memory device of claim 11, wherein the insulation layer comprises at least one of silicon oxide, silicon nitride and silicon oxynitride.

15. The ferroelectric memory device of claim 11, further comprising
a channel region disposed in the indium-gallium-zinc oxide layer below the gate electrode layer.

16. The ferroelectric memory device of claim 11,
wherein the indium-gallium-zinc oxide layer comprises a channel region disposed between the source electrode layer and the drain electrode layer, and
wherein the channel region has one of a plurality of channel resistance states corresponding to the one of the plurality of remanent polarization orientation states when a read voltage is applied to the gate electrode layer.

17. The ferroelectric memory device of claim 11, wherein a depth of the trench is between one-tenth and one-half thickness of the indium-gallium-zinc oxide layer.

18. A ferroelectric memory device comprising:
a substrate;
an indium-gallium-zinc oxide layer having a C-axis aligned crystal structure and disposed on the substrate;
an insulation layer disposed on the indium-gallium-zinc oxide layer;
a ferroelectric material layer disposed on the insulation layer;
a gate electrode layer disposed on the ferroelectric material layer,
a channel region disposed in the indium-gallium-zinc oxide layer below the gate electrode layer; and
a source electrode layer and a drain electrode layer disposed in the indium-gallium-zinc oxide layer opposite to each other with respect to the channel region,
wherein the source electrode layer and the drain electrode layer disposed in a plurality of trenches recessed in the indium-gallium-zinc oxide layer,
wherein the ferroelectric material layer stores one of a plurality of remanent polarization orientation states in a nonvolatile manner, and
wherein the plurality of remanent polarization orientation states correspond to a plurality of program voltages applied to the gate electrode layer, and
wherein the channel region has one of a plurality of channel resistance states corresponding to the one of the plurality of remanent polarization states when a read voltage is applied to the gate electrode layer.

19. The ferroelectric memory device of claim 18, wherein the ferroelectric material layer comprises at least one of $HfO_2$, $ZrO_2$, $Hf_{0.5}Zr_{0.5}O_2$, $PbZr_xTi_{1-x}O_3$ (0<x<1, PZT), Ba(Sr, Ti)$O_3$ (BST), $Bi_{4-x}La_xTi_3O_{12}$ (0<x<1, BLT), $SrBi_2Ta_2O_9$(SBT), $Pb_5Ge_5O_{11}$(PGO), $SrBi_2Nb_2O_9$(SBN) and $YMnO_3$.

20. The ferroelectric memory device of claim 19, wherein the gate electrode layer comprises at least one selected from tungsten, titanium, copper, aluminum, ruthenium, platinum, iridium, iridium oxide, tungsten nitride, titanium nitride, tantalum nitride, tungsten carbide, titanium carbide, tungsten silicide, titanium silicide, tantalum silicide, and ruthenium oxide.

* * * * *